(12) United States Patent
Jiang et al.

(10) Patent No.: US 8,484,604 B2
(45) Date of Patent: Jul. 9, 2013

(54) CONSTRUCTING A CLOCK TREE FOR AN INTEGRATED CIRCUIT DESIGN

(75) Inventors: Guofan Jiang, Shanghai (CN); Yi Fan Lin, Shanghai (CN); Yang Liu, Shanghai (CN); Hao Yang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/325,102

(22) Filed: Dec. 14, 2011

(65) Prior Publication Data
US 2012/0159416 A1 Jun. 21, 2012

(30) Foreign Application Priority Data
Dec. 20, 2010 (CN) .......................... 2010 1 0612330

(51) Int. Cl.
*G06F 17/50* (2006.01)
(52) U.S. Cl.
USPC ........................................................ 716/134
(58) Field of Classification Search
USPC .................................................. 716/100, 134
See application file for complete search history.

(56) References Cited

U.S. PATENT DOCUMENTS

| | | | | |
|---|---|---|---|---|
| 5,452,239 | A * | 9/1995 | Dai et al. ......................... | 703/19 |
| 6,327,167 | B1 * | 12/2001 | Morgan et al. ................... | 365/51 |
| 7,020,861 | B2 * | 3/2006 | Alpert et al. .................... | 716/113 |
| 7,428,716 | B2 * | 9/2008 | Visweswariah ............... | 716/113 |
| 8,010,921 | B2 * | 8/2011 | Visweswariah ............... | 716/113 |
| 2003/0135836 | A1 | 7/2003 | Chang et al. | |
| 2004/0168140 | A1 | 8/2004 | Chang | |
| 2008/0129362 | A1 | 6/2008 | Kawal | |
| 2008/0301594 | A1 * | 12/2008 | Jiang et al. ........................ | 716/2 |
| 2009/0064067 | A1 | 3/2009 | Liu et al. | |
| 2009/0217225 | A1 | 8/2009 | Sunder et al. | |
| 2010/0231282 | A1 | 9/2010 | Singasani | |

OTHER PUBLICATIONS

Velenis, et al. "A Clock Tree Topology Extraction Algorithm for Improving the Tolerance of Clock Distribution Networks to Delay Uncertainty".
Neves, et al. "Automated Synthesis of Skew-Based Clock Distribution Newtorks", VLSI Design, 1998, vol. 7, No. 1, pp. 31-57.
Cunningham, et al. "Clock Concurrent Optimization", AZURO, Inc., Feb. 2009.
Jeng-Liang Tsai, "Clock Tree Synthesis for Timing Convergence and Timing Yield Improvement in Nanometer Technologies", University of Wisconsin-Madison, 2005.

* cited by examiner

*Primary Examiner* — Suchin Parihar
(74) *Attorney, Agent, or Firm* — Richard M. Kotulak

(57) ABSTRACT

A method and apparatus for constructing a clock tree for an integrated circuit design is disclosed, the method comprising: extracting the path delays between the sequential devices in a placed netlist by performing timing analysis on the placed netlist; and constructing a clock tree for driving the sequential devices according to the path delays between the sequential devices so as to make the sum of the products of the timing delay between any two sequential devices and a clock tree branch weight of the two sequential devices minimum, wherein the clock tree branch weight of the two sequential devices is positively correlated with the number of clock tree levels from the branch point of the clock tree relative to the two sequential devices to the two sequential devices.

20 Claims, 9 Drawing Sheets

| k \ j | 0 | 1 | 2 | ...... | $2^t-2$ | $2^t-1$ |
|---|---|---|---|---|---|---|
| 0 | 0 | $CKweight_{(0,1)}$ | $CKweight_{(0,2)}$ | ... | $CKweight_{(0,2^t-2)}$ | $CKweight_{(0,2^t-1)}$ |
| 1 | $CKweight_{(1,0)}$ | 0 | | ... | $CKweight_{(1,2^t-2)}$ | $CKweight_{(1,2^t-1)}$ |
| 2 | $CKweight_{(2,0)}$ | | 0 | ... | $CKweight_{(2,2^t-2)}$ | $CKweight_{(2,2^t-1)}$ |
| ...... | ... | ... | ... | ... | ... | ... |
| $2^t-2$ | $CKweight_{(2^t-2,0)}$ | $CKweight_{(2^t-2,1)}$ | $CKweight_{(2^t-2,2)}$ | ... | 0 | $CKweight_{(2^t-2,2^t-1)}$ |
| $2^t-1$ | $CKweight_{(2^t-1,0)}$ | $CKweight_{(2^t-1,1)}$ | $CKweight_{(2^t-1,2)}$ | ... | $CKweight_{(2^t-1,2^t-2)}$ | 0 |

Fig. 5

| k \ j | 0 | 1 | 2 | ...... | $2^t-2$ | $2^t-1$ |
|---|---|---|---|---|---|---|
| 0 | M | $DDly_{(0,1)}$ | $DDly_{(0,2)}$ | ... | $DDly_{(0,2^t-2)}$ | $DDly_{(0,2^t-1)}$ |
| 1 | $DDly_{(1,0)}$ | M | $DDly_{(1,2)}$ | ... | $DDly_{(1,2^t-2)}$ | $DDly_{(1,2^t-1)}$ |
| 2 | $DDly_{(2,0)}$ | | M | ... | $DDly_{(2,2^t-2)}$ | $DDly_{(2,2^t-1)}$ |
| ...... | ... | ... | ... | ... | ... | ... |
| $2^t-2$ | $DDly_{(2^t-2,0)}$ | $DDly_{(2^t-2,1)}$ | $DDly_{(2^t-2,2)}$ | ... | M | $DDly_{(2^t-2,2^t-1)}$ |
| $2^t-1$ | $DDly_{(2^t-1,0)}$ | $DDly_{(2^t-1,1)}$ | $DDly_{(2^t-1,2)}$ | ... | $DDly_{(2^t-1,2^t-2)}$ | M |

Fig. 6

| Selling places / Production places | $B_1$ | $B_2$ | ... | $B_n$ | Production volume |
|---|---|---|---|---|---|
| $A_1$ | $C_{11}$ | $C_{12}$ | | $C_{1n}$ | $s_1$ |
| $A_2$ | $C_{21}$ | $C_{22}$ | ... | $C_{2n}$ | $s_2$ |
| ... | | | | | |
| $A_m$ | $C_{m1}$ | $C_{m2}$ | | $C_{mn}$ | $s_m$ |
| Selling volume | $d_1$ | $d_2$ | | $d_n$ | |

Fig. 7

CONSTRUCTING A CLOCK TREE FOR AN INTEGRATED CIRCUIT DESIGN

FIELD OF THE INVENTION

The present invention relates to the automation of integrated circuit design, particularly to the construction and optimization of a clock tree for integrated circuit design, and more particularly, to a method and apparatus for constructing a clock tree for an integrated circuit design.

DESCRIPTION OF THE RELATED ART

In large-scale integrated circuit design, a single clock source signal will drive a plurality of sequential devices (registers, latches, memories). If the sequential devices are driven directly by the clock source signal, the driving load capacity will become a problem, and the wiring from the clock source to the register's clock end will be too long to bring about too much delay. Therefore, currently, a clock distribution network is usually used to drive sequential devices, which clock distribution network is formed by inserting buffers or inverters between the clock source and the sequential devices. Current clock distribution network usually adopts the architecture of a clock tree. FIG. 1 shows a schematic diagram of driving sequential devices by a clock tree. As shown, a clock tree is formed by a clock source and multi-level buffers (or inverters), and the buffers as leaf nodes of the clock tree drive the respective sequential devices FF.

The setup time refers to the time required for the data from an unstable state to a stable state before the clock sampling edge comes; and if the setup time does not satisfy the timing requirement, the data cannot be stably captured by the sequential device at this clock edge. The hold time refers to the time the data is required to be held after it is stabilized. If the hold time does not satisfy the timing requirement, the data cannot be stably captured by the sequential device either. FIG. 2 depicts a schematic diagram of the setup time and the hold time. As shown, the data signal Data output by the first sequential device (which can be called a launch device) is transmitted to the input of the second sequential device (which can be called a capture device) via a combinational logic, and the clock signal Clock controls the second sequential device to capture the data signal. In order for the data signal to be correctly captured by the second sequential device, the data signal should reach the input of the second sequential device at least Tsetup time before the clock edge, and hold at least Thold time after the clock edge. Tsetup is the setup time, and Thold is the hold time.

Every device in the transmission paths of the data signal and the clock signal will cause delay. Due to the influence of the techniques, temperatures and voltages, the delay of each device fluctuates within a certain range of [lb, ub]. The delay of the entire path calculated with the lower limit lb of the delay fluctuation of each device is called the path delay of the early mode; and the delay of the entire path calculated with the upper limit ub of the delay fluctuation of each device is called the path delay of the late mode.

In an integrated circuit, the clock determines the cycle time of data transmission and control, and determines the maximum frequency that the design can achieve. In order to guarantee that every device in the integrated circuit operate correctly, the delay of the clock path and the delay of the data path must satisfy a certain relationship.

However, current clock tree synthesis tools usually measure the quality of a clock tree according to the time skew, and use the clock tree synthesis method driven by the clock skew. Usually, problems caused by insufficient shared clock path optimization can only be found after the clock tree synthesis is accomplished, and then manual optimization is performed. This is not only a time-consuming work, but also, since the integrated circuit design includes a large amount of sequential devices on which timing check needs to be performed, it is very difficult to find an optimization scheme of common clock path that satisfies the timing check requirements of all the sequential devices.

SUMMARY OF THE INVENTION

According to an aspect of the present invention, there is provided a method for constructing a clock tree for integrated circuit design, comprising: extracting the path delays between the sequential devices in a placed netlist by performing timing analysis on the placed netlist; and constructing a clock tree for driving the sequential devices according to the path delays between the sequential devices, so as to minimize the sum of the products of the timing delay between any two sequential devices and a clock tree branch weight of the two sequential devices, wherein the clock tree branch weight of two sequential devices is positively correlated with the number of clock tree levels from the branch point of the clock tree with respect to the two sequential devices to the two sequential devices.

According to another aspect of the present invention, there is provided an apparatus for constructing a clock tree for integrated circuit design, comprising: an extraction module for extracting the path delays between the sequential devices in a placed netlist by performing timing analysis on the placed netlist; a constructing module for constructing a clock tree for driving the sequential devices according to the path delays between the sequential devices, so as to minimize the sum of the products of the timing delay between any two sequential device and a clock tree branch weight of the two sequential devices, wherein the clock tree branch weight of two sequential devices is positively correlated with the number of clock tree levels from the branch point of the clock tree with respect to the two sequential devices to the two sequential devices.

Since the method of the present invention can construct a clock tree according to the path delays between the sequential devices extracted from the netlist, and the clock tree minimizes the products of the timing delays between the sequential devices and the clock tree branch weights, a criterion for evaluating the degree of common clock path of sequential devices of the integrated circuit design is proposed, and the automatic generation of a clock tree with common clock path optimization for a specific integrated circuit design can be realized.

BRIEF DESCRIPTION OF THE DRAWINGS

The appended claims set forth the inventive features which are considered as characteristic of the present invention. However, the invention itself and its preferred embodiments, additional objects, features and advantages will be better understood by referring to the detailed description of the exemplary embodiments when read in conjunction with the accompanying drawings, in which:

FIG. 5 shows a clock tree branch weight matrix representing the clock tree branch weight between any two registers in an integrated circuit design;

FIG. 6 shows a data path delay matrix representing the data path delay between any two registers in an integrated circuit design;

FIG. 7 shows a table of the production volumes of production places, the selling volumes of selling places, as well as the transportation unit price between each production place and each selling place in the transportation problem;

DETAILED DESCRIPTION OF EXEMPLARY EMBODIMENTS

Embodiments of the present invention will now be described with reference to the accompanying drawings. In the following description, numerous details are described to enable the present invention to be fully understood. However, it is obvious to those skilled in the art that the realization of the present invention can be without some of these details. In addition, it should be appreciated that the present invention is not limited to the described specific embodiments. On the contrary, it is contemplated to implement the present invention by using any combination of the following features and elements, no matter whether they involve different embodiments or not. Therefore, the following aspects, features, embodiments and advantages are only illustrative, rather than elements or limitations of the appended claims, unless explicitly stated otherwise in the claims.

First, the basic ideas of a method for constructing a clock tree for in integrated circuit design according to an embodiment of the present invention will be described with reference to the accompanying drawing.

Figure 1:
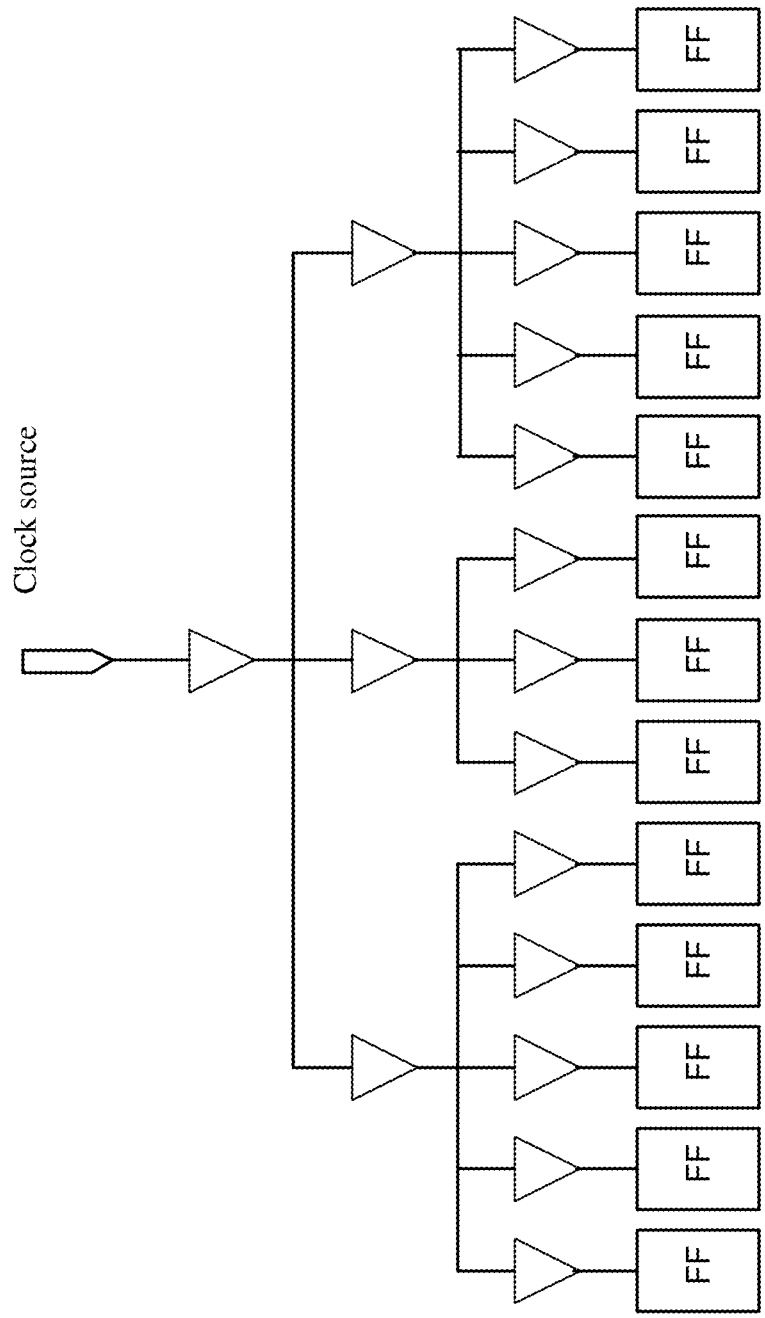
FIG. 1 shows a schematic diagram of driving sequential devices by a clock tree.
Figure 2:
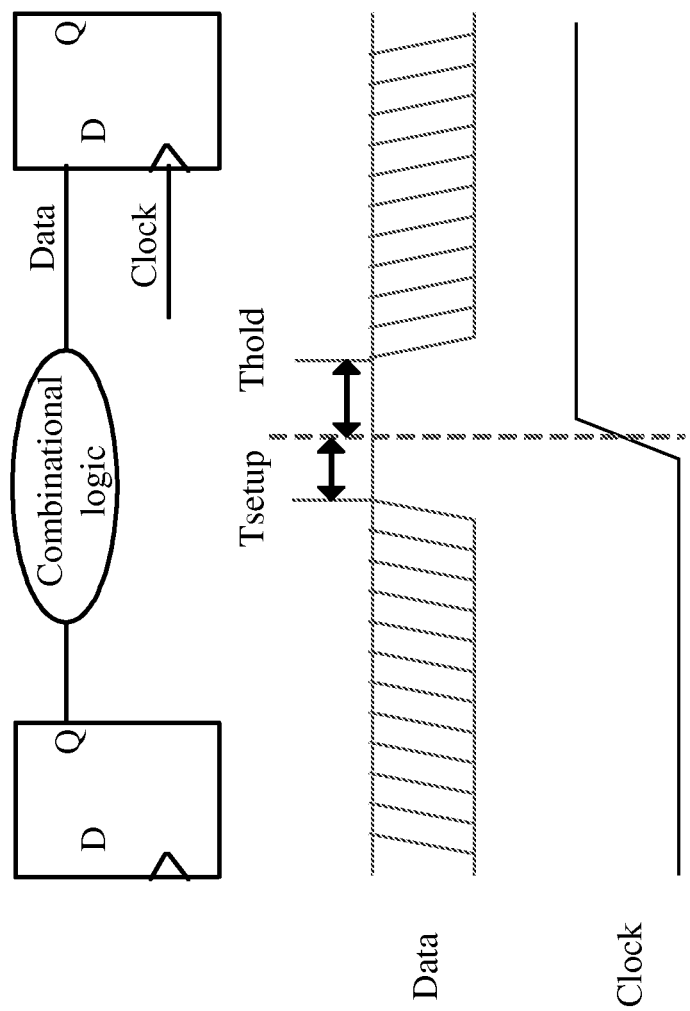
FIG. 2 shows a schematic diagram of the setup time and hold time.
Figure 3:
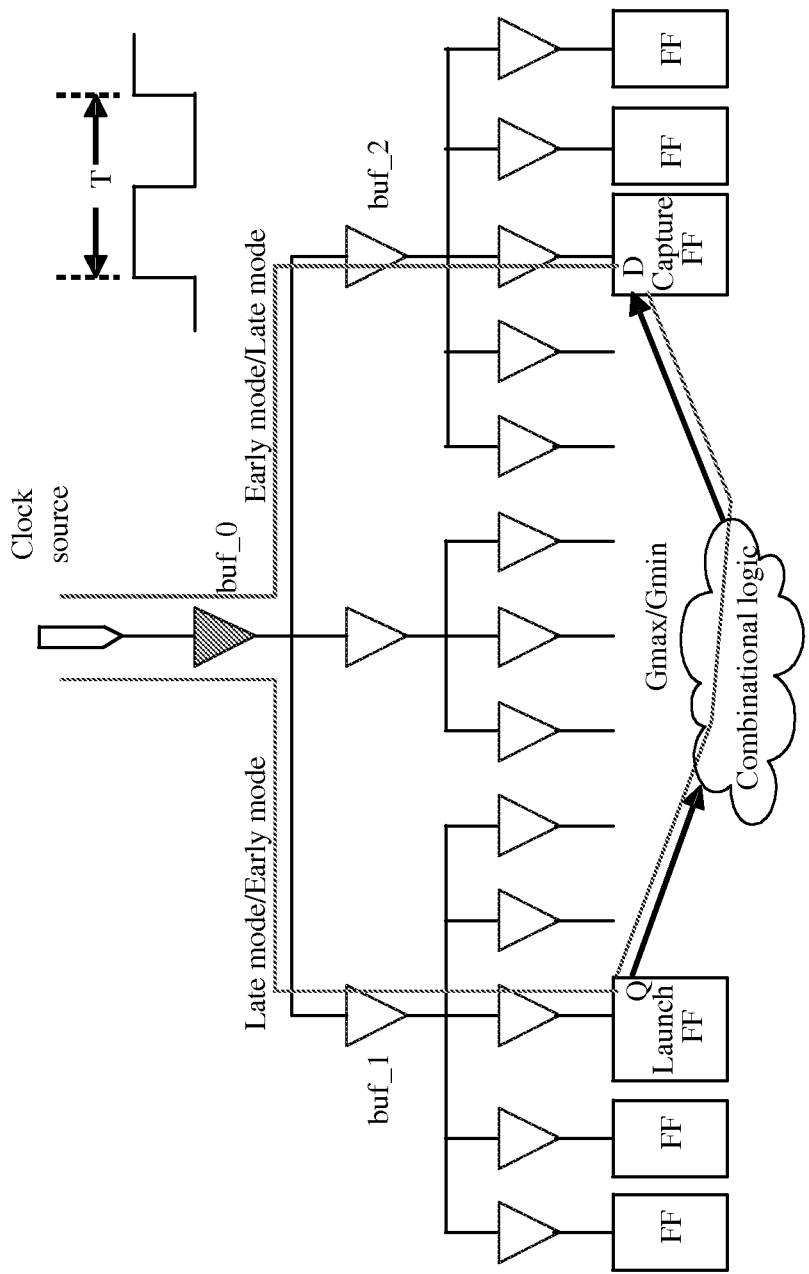
FIG. 3 shows a schematic diagram of a clock tree driving logic devices and related delay relationships.

FIG. 3 shows a schematic diagram of a clock tree driving logic devices and related delay relationships. As shown, the clock signal drives the launch sequential devices through a clock path including the clock source, buffer buf_0, buffer buf_1, and drives the capture register through a clock path including the clock source, buffer buf_0, buffer buf_2; and the data signal output by the launch sequential device is transmitted to the input of the capture register via a combinational logic. In the illustrated circuit, in order to guarantee that the devices operate correctly, the following formula must be satisfied:

$$L1+Gmax+Tsetup<T+C1$$

wherein, L1 is the time delay of the late mode from the clock source to the launch register, C1 is the time delay of the early mode from the clock source to the capture register, Gmax is the time delay of the late mode of the combinational logic between two registers, Tsetup is the setup time, and T is the clock cycle.

From the above formula, the following can be obtained: $T>(L1-C1)+Gmax+Tsetup$. It can be seen that the smaller the difference between L1 and C1 is, the smaller the clock cycle that can be realized is, i.e., the greater the clock frequency that can be realized is. In the above drawing, assume buffers buf_1 and buf_2 are buffers of the same type and have the same delay. However, when calculating L1 and C1, buf_1 will use the delay of the late mode, i.e., the upper limit of the delay; and buf_2 will use the delay of the early mode, i.e., the lower limit of the delay. This is because buf_1 and buf_2 are in different paths. However, the delay of buf_0 will be the same in calculating L1 and C1, since L1 and C1 share buf_0, and it is impossible for buf_0 to have different delays at the same time. Therefore, a conclusion can be reached that for two registers having a data transfer relationship, the greater common clock path they have, the smaller the difference between L1 and C1 is, and thus it is more helpful to increasing the clock frequency.

In the circuit shown in FIG. 3, in order to guarantee the correct operation of the devices, the following formula must also be satisfied:

$$L2;+Gmin>C2+Thold$$

Wherein, L2 is the delay of the early mode from the clock source to the launch register, C2 is the delay of the late mode from the clock source to the capture register, and Gmin is the delay of the early mode of the combinational logic between two registers.

From the above formula, the following can be obtained: $C2-L2<Gmin-Thold$. If C2 and L2 completely share the clock path, then $C2-L2=0$, i.e., $Gmin>Thold$, which can be satisfied easily. When calculating C2, the delay of the late mode will be used for the unshared clock path; when calculating L2, the delay of the early mode will be used for unshared clock path. Therefore, if the clock path shared by C2 and L2 is small, the difference of C2-L2 will be large, and thus it is hard to satisfy the timing check of $C2-L2<Gmin-Thold$; if the difference of C2-L2 exceeds the clock cycle T, the formula can not be satisfied at all. In this case, it is also desired that the sequential devices having related timing check can share as much clock path as possible.

For each data path between a sequential device (e.g., a register) and a sequential device in an integrated circuit design, the following parameter can be obtained: a data path delay, which can be represented as DDly. If the two sequential devices do not have a data path therebetween, then DDly=0. If the two sequential devices have a data path therebetween, then DDly is equal to the delay of a data signal transmitted on the data path. The data path between two sequential devices refers to a direct data path between the two sequential devices, i.e., the data output by one sequential device is transmitted to the input of the other sequential device via a combinational logic. If between the two sequential devices there is another sequential device, then there is no direct data path between the two sequential devices. The parameter can be obtained by performing timing analysis on the netlist of the integrated circuit design.

Assuming the clock tree has been synthesized into the integrated circuit design by clock tree synthesis, for each data path between a sequential device and a sequential device, the following parameter can be obtained: a clock tree branch weight, which can be represented as CKweight. For a given clock tree, the CKweight between a sequential device and itself is 0; if the clock paths of the two sequential devices branch at a buffer at the last level of the clock tree, CKweight=1; if the clock paths of the two sequential devices branch at a buffer at the second last level of the clock tree, CKweight=2; and so forth.

Figure 4:
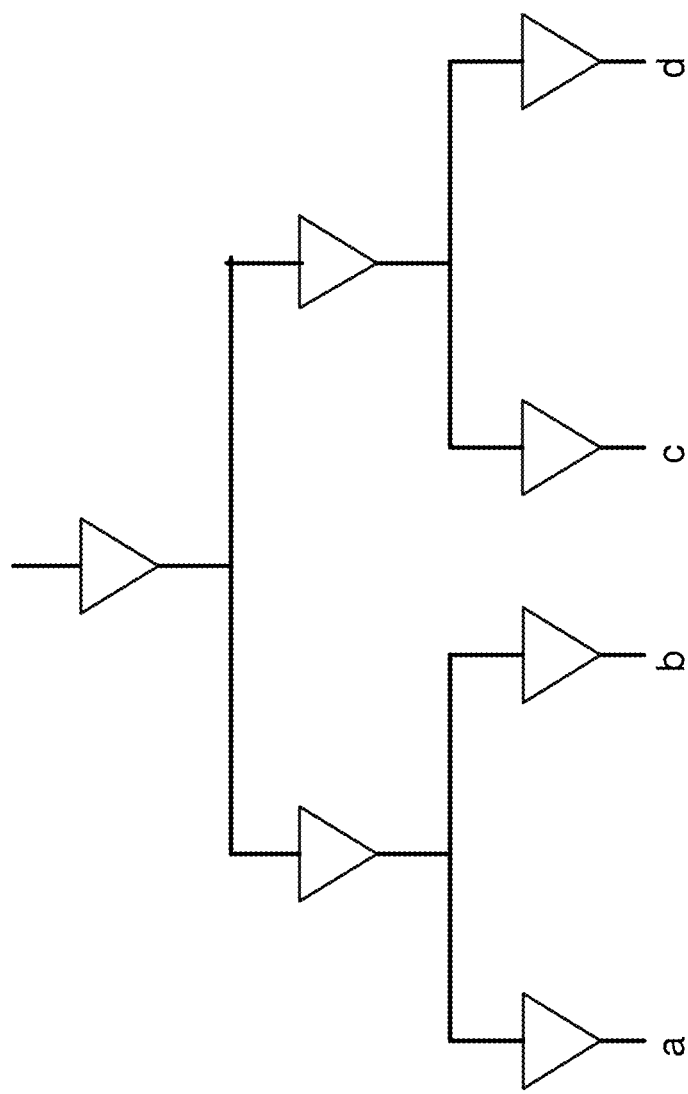
FIG. 4 shows a schematic diagram of a clock tree, as a binary tree, driving sequential devices a, b, c and d.

Since in clock tree synthesis, a binary tree is a widely-used tree structure, it is assumed that the present invention uses a binary tree. FIG. 4 shows a schematic diagram of a clock tree, as a binary tree, driving sequential devices a, b, c and d. In the drawing:

CKweight between a and b=1;
Ckweight between a and c=2;
Ckweight between a and d=2;
Ckweight between c and d=1;
Ckweight of any sequential device to itself=0.

Thus, for the path between every two sequential devices in the integrated circuit design, a product can be obtained: DDly*CKweight. Then, sum all the DDly*CKweight. If the sum is the minimum, the clock tree is considered optimal on the basis of the maximum common clock path. That is to say, if the sum of the products of the path delay between any two sequential devices and the clock tree branch weight of the two sequential devices is the minimum, then the clock path is optimal. Therefore, the following formula can be obtained:

$$MinF = \sum_{j=0}^{2^t-1} \sum_{k=0}^{2^t-1} DDly(j,k) \times CKweight(j,k)$$

Wherein, DDly(j,k) is a data path delay between the $j^{th}$ and the $k^{th}$ sequential devices; CKweight(j, k) is the clock tree branch weight between the $j^{th}$ and the $k^{th}$ sequential devices, and it is assumed the integrated circuit design includes $n=2^t$ sequential devices. If the number of actual sequential devices included in the integrated circuit design is less than $2^t$, it is assumed that there are $2^t-m$ virtual sequential devices, which do not have data paths with other sequential devices, i.e., DDly=0, and thus the total number of the actual sequential devices and the virtual sequential devices are still $n=2^t$.

Thus, the task of constructing the optimal clock tree for the integrated circuit design becomes constructing such a clock tree as to make the sum of the products of its CKweight(j, k) and the corresponding DDly(j, k), i.e., MinF, minimum.

Various methods can be used to obtain the clock tree making the MinF minimum. According to an embodiment of the present invention, the CKweight(j, k) between any two sequential devices in an integrated circuit design can be represented in a matrix form as shown in FIG. 5. The matrix can be called a clock tree branch weight matrix, its element CKweight(j, k) denoting the clock tree branch weight between the sequential devices j and k.

The CKweight matrix satisfies the following conditions:

Since the clock tree is a binary tree, each row or each column of the CKweight matrix includes one 0, one 1, two 2s, four 3s, eight 4s, ..., $2^{t-1}$ ts. Therefore, the sum of the elements in each row or each column is:

$$\sum_{n=1}^{t} 2^{n-1} n$$

2. The elements on the diagonal line are 0;
3. It is a symmetrical matrix, i.e., CKweight(k, j)=CKweight(j, k).

For a given integrated circuit design, each specific clock tree corresponds to a specific CKweight matrix. The elements of each row and each column of different CKweight matrixes corresponding to different clock trees of the integrated circuit design are the same, but the positions of the elements in each row and each column are different.

Therefore, the task of constructing an optimal clock tree for an integrated circuit becomes determining a specific CKweight matrix of which the elements have specific positions. That is to say, it is known which elements are included in the matrix, but the positions of the elements in the matrix are unknown and need to be determined The data path delay DDly between any two sequential devices in the integrated circuit design can be represented in a matrix form as shown in FIG. 6, and the matrix can be called a data path delay matrix, or DDly matrix, which corresponds to the rows and columns of the CKweight matrix, and its element DDly(j, k) denotes the delay of the data path between the sequential devices j and k. If there is no data path between two sequential devices, the element is 0. The element on the diagonal line of the matrix denotes the delay from the output of the sequential device to the input of this sequential device, and since the corresponding CKweight is 0, the element does not need to be filled with the actual delay, and can be filled with any value, which is denoted by "M" in the drawing. As known by those skilled in the art, an integrated circuit design can be represented by a netlist. The data path delay between any two sequential devices can be obtained by performing timing analysis on the placed netlist.

Now, the task for constructing an optimal clock tree for an integrated circuit design becomes: the DDly matrix being known, constructing a CKweight matrix satisfying the above three conditions and making the sum of the products of the elements of the two matrixes minimum.

This problem can be solved using various methods. According to an embodiment of the present invention, the problem can be solved using the transportation theory in Operations Research. The transportation theory is used to solve the transportation problem, and it can be described briefly as follows:

Assume $A_1, A_2, \ldots, A_m$ denote m production places of a material; $B_1, B_2, \ldots, B_n$ denote n selling places of the material; $s_i$ denotes the production volume of the production place Ai; $d_j$ denotes the selling volume of the selling place $B_j$; $c_{ij}$ denotes the unit transportation price for transporting the material from the production place $A_i$ to the selling place $B_j$.

Then in the case of balanced supply and selling:

$$\sum_{j=1}^{n} d_i = \sum_{i=1}^{m} s_i$$

FIG. 7 lists the production volumes of the production places, the selling volumes of the selling places, and the transportation unit price between each production place and each selling place in the form of a table.

The transportation theory attempts to find a transportation scheme for transporting materials from production places to selling places with a minimum cost. Assuming $x_{ij}$ is the transportation volume from the production place $A_i$ to the selling place $B_j$, the following model of transportation volume problem can be obtained:

$$Minf = \sum_{i=1}^{m} \sum_{j=1}^{n} c_{ij} x_{ij}$$

$$\begin{cases} \sum_{j=1}^{n} x_{ij} = s_i \\ \sum_{i=1}^{m} x_{ij} = d_j \\ x_{ij} \geq 0 (i = 1, 2, \ldots m; j = 1, 2, \ldots, n) \end{cases}$$

The transportation theory can use various known methods, such as the table method, block-wise optimization method, direct algorithm, etc., to solve the above transportation problem. Taking the table method as an example, its basic steps are: 1. find an initial basic feasible solution by using the north-west corner method or the minimum element method; 2. determine an optimal solution by using the closed loop method or potential method to get a test number of non-basic variables; 3. determine entering variables and leaving variables by using the closed loop adjustment method to find a new basic feasible solution; 4. repeat steps 2, 3 until the optimal solution is reached. Since the solving method of the transportation problem per se do not belong to the contents of the present invention, it is not described in detail here, and one can refer to the following documents: Chen Baoling, He Jianyong, "An Interpretation of the Table Manipulation Method in Transportation Problem"[J]. *Journal of Tsinghua University (Science and Technolog)*, 1998,38(12): 40-43; Jiang Hongfeng, "Selection-by-Block Method in the Transportation Problem", *Science Technology and Engineering*, 2006, 8 (4): 922-925; Jiang Hongfeng, "Direct Algorithm in the Transportation Problem", *Science Technology and Engineering*, 2010; 17 (6): 4109-4112, etc.

According to an embodiment of the present invention, the method of solving the CKweight matrix is converted into the transportation problem, so that it can be solved by using the transportation theory. Since the sum of the elements of each row and each column in the CKweight matrix is fixed, this is similar to that in the transportation problem, the production volume of each production place and the selling volume of each selling place are fixed. Each element in the CKweight matrix needs to be multiplied by the corresponding element in the DDly matrix, and this is similar to that in the transportation problem, the transportation volume between a production place and a selling place needs to be multiplied by the transportation unit price between the production place and the selling place. Therefore, the rows and columns of the CKweight matrix may be viewed as the production places and selling places, or selling places and production places, respectively, and each element in the CKweight matrix may be viewed as the transportation volume from one production place to one selling place in the transportation problem; the sum of the elements of one row in the CKweight matrix may be viewed as the production volume of one production place or the selling volume of one selling place, and the sum of the elements of one column in the CKweight matrix may be viewed as the selling volume of one selling place or the production volume of one production place; the rows and columns of the DDly matrix may be correspondingly viewed as the production places and selling places, or the selling places and production places, respectively, and each element in the DDly matrix may be viewed as the transportation unit price between the production place and selling place to which its row and column correspond. In this way, the problem of finding a solution making the sum of the products of each element in the CKweight matrix and each corresponding element in the DDly matrix minimum in converted into the problem of finding a transportation scheme with the minimum transportation cost between the production places and selling places, so that various known methods in the transportation theory to be used to find the solution.

After the CKweight matrix is obtained, the topology of the clock tree represented by the matrix can be obtained. Then, the clock tree can be inserted into the placed netlist, and clock routing is performed, so as to obtain a clock tree synthesized integrated circuit design.

Above is described the basic ideas of the method for constructing a clock tree for an integrated circuit design according to embodiments of the present invention. According to an embodiment of the present invention, the method for constructing the clock tree for an integrated circuit design comprises the following steps: extracting path delays between the sequential devices in a placed netlist by performing timing analysis on the placed netlist; and constructing a clock tree for driving the sequential devices according to the path delays between the sequential devices, so as to make the sum of the products of the timing delay between any two sequential devices and the clock tree branch weight of the two sequential devices minimum, wherein the clock tree branch weight of two sequential devices is positively correlated with the number of clock tree levels from the branch point of the clock tree with respect to the two sequential devices to the two sequential devices. That is to say, any method for constructing the clock tree, as long as the constructed clock tree makes the sum of the products of the path delay between two sequential devices and the clock tree branch weight of the two sequential devices minimum, can solve the technical problem intended to be solved by the present invention.

Figure 8:
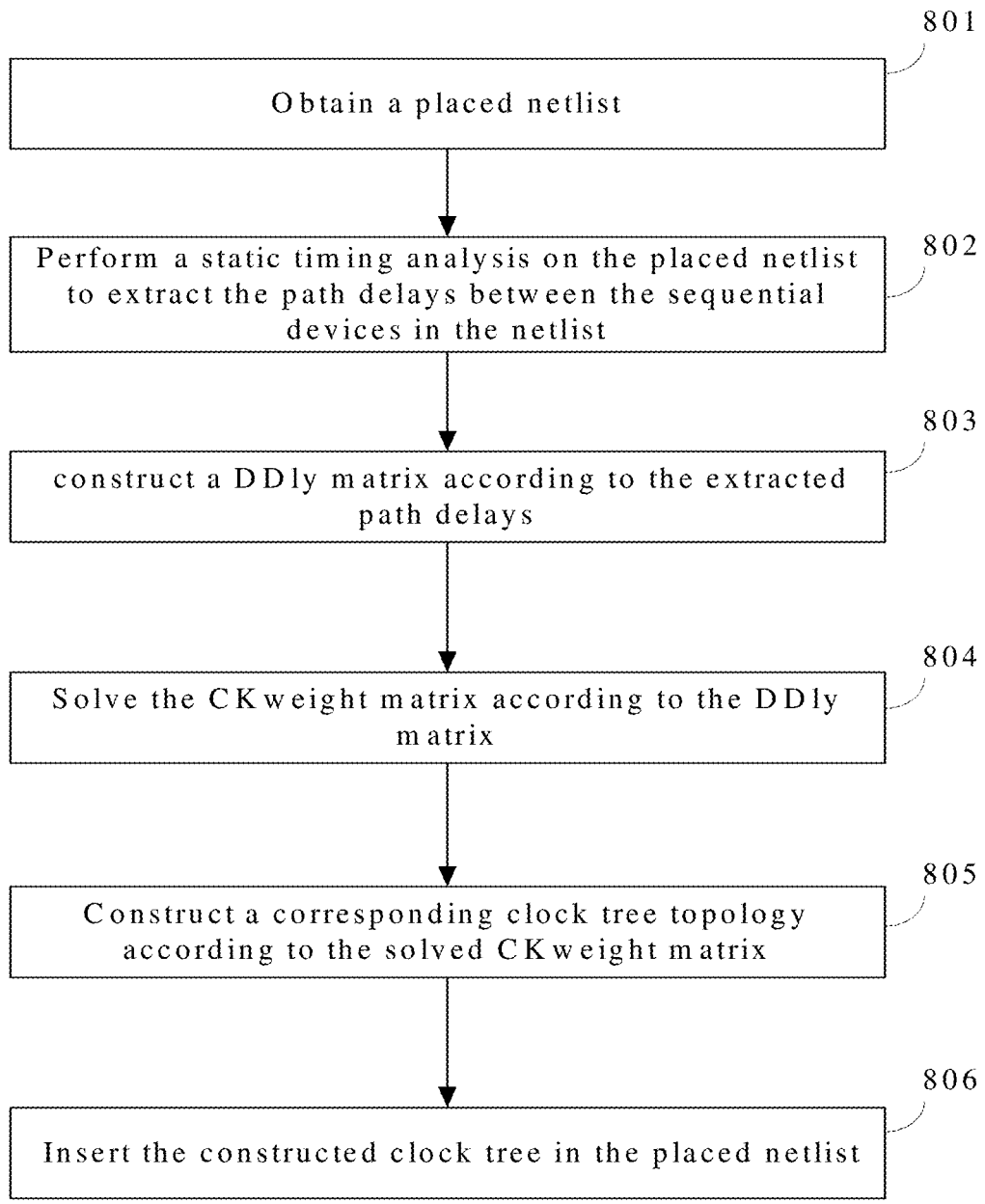
FIG. 8 shows a process of a method for constructing a clock tree topology for an integrated circuit design according to an embodiment of the present invention.

In a preferred implementation, the process of the method for constructing a clock tree topology for an integrated circuit design according to an embodiment of the present invention will be described by referring to FIG. 8. As shown, the method comprises the following steps:

In step 801, a placed netlist is obtained. As known by those skilled in the art, a netlist is usually generated from a hardware description language by integrated circuit design automation tools, and is used in the physical design phase of the automation integrated circuit design.

In step 802, timing analysis is performed on the placed netlist to extract the data path delays between the sequential devices in the netlist. The data path delay between sequential devices that do not have a data pathway relationship is assumed to be 0. As known by those skilled in the art, the data path delays can be generated by existing timing analysis tools.

In step 803, a DDly matrix is constructed according to the extracted data path delays. The rows and columns of the DDly matrix represent the sequential devices in the integrated circuit design, and its elements represent data path delays between pairs of sequential devices, wherein the data path delay between a pair of sequential devices that do not have a data pathway relationship is 0. The numbers of rows and columns of the DDly matrix are both $2^r$. In the case that the number of sequential devices contained in a netlist is $m<2^r$, $2^r-m$ virtual sequential devices is provided to make the total number of the sequential devices to be $2^r$, wherein the path delays between virtual sequential devices and those between virtual devices and actual sequential devices contained in the netlist are all 0.

In step 804, a CKweight matrix is solved according to the DDly matrix, so as to make the sum of the products of each element in the CKweight matrix and the corresponding element in the DDly matrix minimum. That is to say, the sum of the products of the path delay between any two sequential devices and the clock tree branch weights of the two sequential devices is minimized. Therein, the CKweight matrix corresponds to the rows and columns of the DDly matrix, and its elements are the clock tree branch weights, which represent the number of clock tree levels from the branch point of the clock tree with respect to the two sequential devices to the two sequential devices. Since the clock tree is a binary tree, each row or each column of the CKweight matrix includes one 0, one 1, two 2s, four 3s, eight 4s, ..., $2^{r-1}$ ts; the elements on the diagonal line are 0s; and it is a symmetric matrix, i.e., CKweight (k, j)=CKweight (j, k).

According to an embodiment of the present invention, the Ckweight matrix is solved according to the DDly matrix by using the transportation theory, wherein the rows and columns of the DDly matrix are viewed as representing production places and selling places, or selling places and production places, respectively, and its elements are viewed as representing the unit transportation costs between the production places and selling places; the rows and columns of the CKweight matrix are the same as the rows and columns of the DDly matrix, and are also viewed as representing the production places and selling places, or selling places and production places, respectively, and its elements are viewed as representing the volumes of goods transported from the corresponding production places to the corresponding selling places; the sum of the products of each element in the DDly matrix and the corresponding element in the CKweight matrix is viewed as the total transportation cost.

In step 805, a corresponding clock tree is constructed according to the solved CKweight matrix. As those skilled in the art would appreciate, the CKweight matrix is actually a matrix representation of the clock tree topology. For example, if an element in the CKweight matrix is 1, this indicates that the two sequential devices to which the row and column of the element correspond respectively branch at a buffer at the lowest level of the clock tree; if an element is 2, this indicates that the two sequential devices to which the row and the column of the element correspond respectively branch at a buffer at the second lowest level of the clock tree; . . . ; if an element is i, this indicates that the two sequential devices to which the row and the column of the element correspond respectively branch at a buffer at the $i^{th}$ level counting backward of the clock tree. In this way, a corresponding clock tree can be constructed according to the CKweight matrix.

In step 806, the constructed clock tree is inserted into the placed netlist, so as to be able to perform clock routing on the inserted clock tree to finally get a clock tree synthesized integrated circuit design. The method for performing clock routing on an inserted clock tree is known in the art.

Above is described the method for constructing a clock tree for an integrated circuit according to embodiments of the present invention by referring to the accompanying drawings. It should be pointed out that the above description is only exemplary, rather than limitation to the present invention. In other embodiments of the present invention, the method may have more, less or different steps, and the order of the steps may be different from that is described. Furthermore, it should be pointed out that the above description includes numerous technical details in order for those skilled in the art to better understand the present invention. However, some embodiments of the present invention may exclude some of these technical details, or include these technical details by way of generalization.

For example, according to a further embodiment of the present invention, the constructing a clock tree for driving the sequential devices according to the path delays between the sequential devices comprises: constructing a path delay matrix DDly according to the path delays between the sequential devices, wherein the element DDly(j, k) of the path delay matrix DDly denotes the path delay between the sequential devices j and k, wherein the path delay between two sequential devices that do not have a data pathway relationship is 0; solving a clock tree branch weight matrix CKweight according to the path delay matrix, wherein the element CKweight(j, k) of the clock tree branch weight matrix CKweight denotes the clock tree branch weight between the two sequential devices j and k, and wherein the sum of the products of each element DDly(j, k) of the path delay matrix DDly and the corresponding element CKweight (j, k) of the clock tree branch weight matrix CKweight is minimized; and constructing the clock tree according to the clock tree branch weight matrix.

For further example, according to a further embodiment of the present invention, the clock tree is a binary tree, and the clock tree branch weight between two sequential devices is equal to number of the clock tree levels from the branch point of the clock tree with respect to the two sequential devices to the two sequential devices, and the clock tree branch weight between a sequential device and itself is zero.

For further example, according to a further embodiment of the present invention, the number of rows and the number of columns of the path delay matrix DDly and the clock tree branch weight matrix CKweight are all $2^t$, t being a positive integer, and when the number m of the actual sequential devices in the integrated circuit design is smaller than $2^t$, the rows and columns of the path delay matrix DDly and the clock tree branch weight matrix CKweight further include $2^t-m$ virtual sequential devices, and the data path delay between a virtual sequential device and an actual sequential device and that between virtual sequential devices are 0.

For further example, according to a further embodiment of the present invention, the solving the clock tree branch weight matrix according to the path delay matrix is performed by applying the transportation theory, wherein the rows and columns of the path delay matrix are viewed as representing production places and selling places, or selling places and production places, respectively, and its elements are viewed as unit transportation cost between the production places and selling places; the rows and columns of the clock tree branch weight matrix are viewed as representing the production places and selling places, or selling places and production places, respectively, and its elements are viewed as representing the volume of goods transported from the corresponding production places to the corresponding selling places; the sum of the products of each element in the path delay matrix and the corresponding element in the clock tree branch weight matrix is viewed as the total transportation cost; moreover, the elements in each row and each column in the clock tree branch weight matrix are all one 0, one 1, two 2s, four 3, . . . , $2^{t-1}$ ts.

For further example, according a further embodiment in the present invention, the method further comprises: inserting the clock tree into the placed integrated circuit design, so as to get a clock tree synthesized integrated circuit design.

Figure 9:
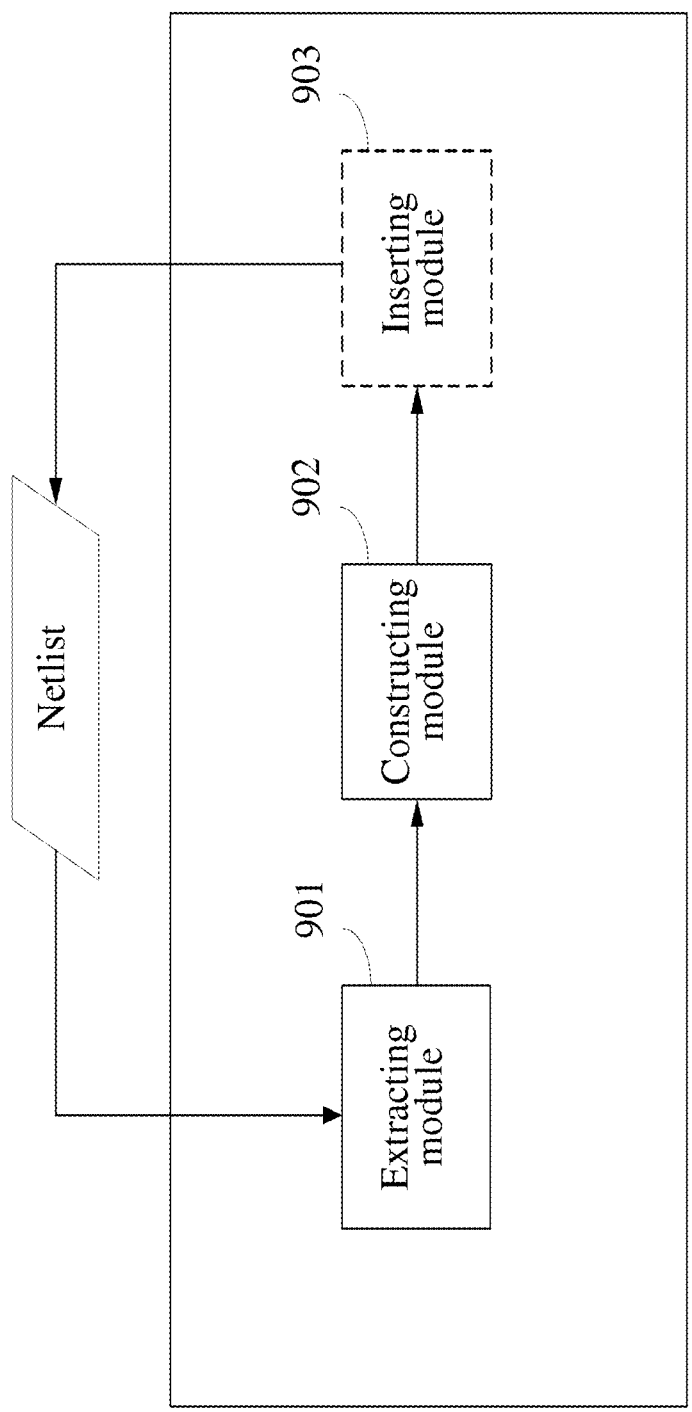
FIG. 9 shows an apparatus for constructing a clock tree for an integrated circuit design according to an embodiment of the present invention.

Now an apparatus for constructing a clock tree for an integrated circuit design according to an embodiment of the present invention will be described with reference to FIG. 9. The apparatus may be included in an existing clock tree synthesis tool as part of the clock tree synthesis tool; or it may be external to an existing clock tree synthesis tool and cooperate with the tool, that is to say, the apparatus may provide the constructed clock tree to the existing clock tree synthesis tool, so that the clock tree synthesis tool may insert the clock tree into the integrated circuit design.

As shown, the apparatus comprises: an extracting module 901 for extracting the path delays between the sequential devices in a netlist by performing timing analysis on the placed netlist; a constructing module 902 for constructing a clock tree for driving the sequential devices according to the path delays between the sequential devices so as to make the sum of the products of the timing delay between any two sequential device and a clock tree branch weight of the two sequential devices minimum, wherein the clock tree branch weight of the two sequential devices is positively correlated with the number of clock tree levels from the branch point the clock tree with respect to the two sequential devices to the two sequential devices.

According to an embodiment of the present invention, the constructing module 902 comprises: means configured for constructing a path delay matrix DDly according to the path delays between the sequential devices, wherein the element DDly(j, k) of the path delay matrix DDly denotes the path delay between the sequential devices j and k, wherein the path delay between two sequential devices that do not have a data pathway relationship is 0; means configured for solving a clock tree branch weight matrix CKweight according to the path delay matrix DDly, wherein the element CKweight(k, j) of the clock tree branch weight matrix CKweight denotes the clock tree branch weight between the sequential devices j and k, and wherein the sum of the products of every element DDly(j, k) of the path delay matrix DDly and the corresponding element CKweight(k, j) of the clock tree branch weight CKweight is minimized; and means configured for constructing a clock tree according to the clock tree branch weight matrix.

According to an embodiment of the present invention, the clock tree is a binary tree, and the clock tree branch weight between the two sequential devices is equal to the number of clock tree levels from the branch point of the clock tree relative to the two sequential devices to the two sequential devices, and the clock tree branch weight between a sequential device and itself is zero.

According to an embodiment of the present invention, the numbers of rows and columns of the path delay matrix DDly and the clock tree branch weight matrix CKweight are both $2^t$, t being a positive integer; and, when the number of the actual sequential devices in the integrated circuit design is smaller than $2^t$, the rows and columns of the path delay matrix DDly and the clock tree branch weight matrix CKweight further include $2^t-m$ virtual sequential devices, and the path delays between the virtual sequential devices and the actual sequential devices and between the virtual sequential devices are 0.

According to an embodiment of the present invention, the means configured for solving the clock tree branch weight matrix according to the path delay matrix performs the solving by applying the transportation theory, wherein the rows and columns of the path delay matrix are viewed as representing production places and selling places, or selling places and production places, respectively, and its elements are viewed as representing the unit transportation costs between the production places and selling places; the rows and columns of the clock tree branch weight are viewed as representing the production places and selling places, or selling places and production places, respectively, and its elements are viewed as representing the volumes of goods transported from the corresponding production places to the corresponding selling places; the sum of the products of every element in the path delay matrix and the corresponding element in the clock tree branch weight matrix is viewed as the total transportation cost; and, the elements of each row and each column in the clock tree branch weight matrix are all one 0, one 1, two 2s, four 3s, . . . , $2^{t-1}$ ts.

According to an embodiment of the present invention, the apparatus further comprises an optional inserting module 903 for inserting the clock tree into the placed integrated circuit design, so as to get a clock tree synthesized integrated circuit design. In this embodiment, the apparatus actually becomes part of the clock tree synthesis tool.

Above is described an apparatus for constructing a clock tree for an integrated circuit design according to embodiments of the present invention. It should be pointed out that the above description is only exemplary, rather than limitation to the present invention. In other embodiments of the present invention, the apparatus many have more, less or different modules, and the inclusion and connection relationships among the modules may be different from what is described.

The present invention can be realized in hardware, software, or a combination thereof. The present invention can be realized in a computer system in a centralized manner, or in a distributed manner, in which, different components are distributed in some interconnected computer systems. Any computer system or other devices suitable for executing the method described herein are appropriate. A typical combination of hardware and software can be a computer system with a computer program, which when being loaded and executed, controls the computer system to execute the method of the present invention, and constitute the apparatus of the present invention.

The present invention can also be embodied in a computer program product, which can realize all the features of the method described herein, and when being loaded into a computer system, can execute the method.

Although the present invention has been illustrated and described with reference to the preferred embodiments, those skilled in the art will understand that various changes both in form and in details may be made thereto without departing from the spirit and scope of the present invention.

The invention claimed is:

1. A method for constructing a clock tree for an integrated circuit design, comprising:
   using a computer, extracting path delays between sequential devices in a placed netlist by performing timing analysis on the placed netlist; and
   using a computer, constructing a clock tree for driving the sequential devices according to the path delays between the sequential devices so as to make the sum of the products of the timing delay between any two sequential devices and a clock tree branch weight of the two sequential devices minimum, wherein the clock tree branch weight of the two sequential devices is positively correlated with the number of clock tree levels from of the clock tree from the branch point of the clock tree relative to the two sequential devices to the two sequential devices.

2. The method of claim 1, wherein the constructing a clock tree for driving the sequential devices according to the path delays between the sequential devices comprises:
   constructing a path delay matrix DDly according to the path delays between the sequential devices, wherein the element DDly(j, k) of the path delay matrix DDly denotes the delay of the data path between the sequential devices j and k, wherein the path delay between two sequential devices that do not have a data pathway relationship is 0;
   solving a clock tree branch weight matrix CKweight according to the path delay matrix so as to make the sum of the products of every element DDly(j, k) of the path delay matrix DDly and the corresponding element CKweight (j, k) of a clock tree branch weight matrix CKweight minimum, wherein the element CKweight(j, k) of the clock tree branch weight matrix CKweight denotes the clock tree branch weight between the sequential devices j and k; and
   constructing the clock tree according to the clock tree branch weight matrix.

3. The method of claim 2, wherein the clock tree is a binary tree, the clock tree branch weight of the two sequential devices is equal to the number of clock tree levels from the branch point of the clock tree relative to the two sequential devices to the two sequential devices, and the clock tree branch weight between a sequential device and itself is zero.

4. The method of claim 3, wherein the numbers of rows and columns of the path delay matrix DDly and the clock tree branch weight matrix CKweight are both $2^t$, t being a positive integer, and when the number m of the actual sequential devices in the netlist is smaller than $2^t$, the rows and columns of the path delay matrix DDly and the clock tree branch weight matrix CKweight further include $2^t-m$ virtual sequential devices, and the path delays between the virtual devices and the actual sequential devices and between the virtual devices are 0.

5. The method of claim 4, wherein the solving the clock tree branch weight matrix according to the path delay matrix is performed by applying the transportation theory,
wherein the rows and columns of the path delay matrix are viewed as representing production places and selling places, or selling places and production places, respectively, its elements are viewed as representing the unit transportation costs between the production places and selling places; the rows and columns of the clock tree branch weight matrix are viewed as representing the production places and selling places, or selling places and production places, respectively, and its elements are viewed as representing the volumes of goods transported from the corresponding production places to the corresponding selling places; the sum of the products of each element in the path delay matrix and the corresponding element in the clock tree branch weight matrix is viewed as the total transportation cost; and, the elements in each row and each column of the clock tree branch weight matrix are all one 0, one 1, two 2s, four 3s, ..., $i\text{-}2^{t-1}$ts.

6. The method of claim 1, further comprising:
inserting the clock tree into the placed netlist, so as to get a clock tree synthesized integrated circuit design.

7. The method of claim 1, wherein the constructing a clock tree for driving the sequential devices according to the path delays between the sequential devices comprises:
constructing a path delay matrix according to the path delays between the sequential devices, wherein the element of the path delay matrix denotes the delay of the data path between two sequential devices, wherein the path delay between two sequential devices that do not have a data pathway relationship is 0;
solving a clock tree branch weight matrix according to the path delay matrix wherein the element of the clock tree branch weight matrix denotes the clock tree branch weight between the sequential devices; and
constructing the clock tree according to the clock tree branch weight matrix.

8. The method of claim 1, wherein the constructing a clock tree for driving the sequential devices according to the path delays between the sequential devices comprises:
constructing a path delay matrix according to the path delays between the sequential devices;
solving a clock tree branch weight matrix according to the path delay matrix; and
constructing the clock tree according to the clock tree branch weight matrix.

9. The method of claim 1, wherein the constructing a clock tree for driving the sequential devices according to the path delays between the sequential devices comprises:
constructing a path delay matrix according to the path delays between the sequential devices, wherein the element of the path delay matrix denotes the delay of the data path between two sequential devices, wherein the path delay between two sequential devices that do not have a data pathway relationship is 0.

10. The method of claim 2, wherein the minimum is given by the equation:

$$\Sigma_{j=0}^{2^t-1}\Sigma_{k=0}^{2^t-1} DDLy(j,k) \times CKweight(j,k).$$

11. An apparatus for constructing a clock tree for an integrated circuit design, comprising:
an extracting module for extracting path delays between sequential devices in a placed netlist by performing timing analysis on the placed netlist;
a constructing module for constructing a clock tree for driving the sequential devices according to the path delays between the sequential devices so as to make the sum of the products of the timing delay between any two sequential devices and a clock tree branch weight of the two sequential devices minimum, wherein the clock tree branch weight of the two sequential devices is positively correlated with clock tree series of the clock trees from the pair of sequential devices relative to the branch point of the pair of sequential devices.

12. The apparatus of claim 11, wherein the constructing module comprises:
a device for constructing a path delay matrix DDly according to the path delay between the sequential devices, wherein element DDly(j, k) of the path delay matrix DDly denotes a delay of a data path between sequential devices j and k, wherein a path delay between two sequential devices that do not have a data pathway relationship is 0;
a device for solving a clock tree branch weight matrix CKweight according to the path delay matrix, wherein element CKweight(j, k) of the clock tree branch weight matrix CKweight denotes a clock tree branch weight between the sequential devices j and k, and wherein a sum of products of every element DDly(j, k) of the path delay matrix DDly and corresponding element CKweight(j, k) of the clock tree branch weight matrix CKweight is minimum; and
a device for constructing a clock tree according to the clock tree branch weight.

13. The apparatus of claim 11, wherein the clock tree is a binary tree, the clock tree branch weight of the two sequential devices is equal to the number of clock tree levels from the branch point of the clock tree relative to the two sequential devices to the two sequential devices, and the clock tree branch weight between a sequential device and itself is zero.

14. The apparatus of claim 13, wherein the numbers of rows and columns of the path delay matrix DDly and the clock tree branch weight matrix CKweight are both $2^t$, t being a positive integer, and when the number m of the actual sequential devices in the netlist is smaller than 2\ the rows and columns of the path delay matrix DDly and the clock tree branch weight matrix CKweight further include t-m virtual sequential devices, and path delays between the virtual devices and the actual sequential devices and between the virtual devices are O.

15. The apparatus of claim 14, wherein the solving the clock tree branch weight matrix according to the path delay matrix is performed by applying a transportation theory,
wherein the rows and columns of the path delay matrix are viewed as representing production places and selling places, or selling places and production places, respectively, its elements are viewed as representing the unit transportation costs between the production places and selling places; the rows and columns of the clock tree branch weight matrix are viewed as representing the production places and selling places, or the selling places and production places, respectively, and its elements are viewed as representing the volumes of goods transported from the corresponding production places to the corresponding selling places; the sum of the products of each element in the path delay matrix and the corresponding elements in the clock tree branch weight matrix is viewed as the total transportation cost; moreover, the elements in each row and each column of the clock tree branch weight matrix are all one 0, one 1, two 2s, four 3s, ..., $2^{t-1}$ ts.

16. The apparatus of claim 11, further comprising:
an inserting module for inserting the clock tree into the placed netlist, so as to get a clock tree synthesized integrated circuit design.

17. The apparatus of claim 11, wherein the constructing a clock tree for driving the sequential devices according to the path delays between the sequential devices comprises:
constructing a path delay matrix according to the path delays between the sequential devices, wherein the element of the path delay matrix denotes the delay of the data path between two sequential devices, wherein the path delay between two sequential devices that do not have a data pathway relationship is 0;
solving a clock tree branch weight matrix according to the path delay matrix wherein the element of the clock tree branch weight matrix denotes the clock tree branch weight between the sequential devices; and
constructing the clock tree according to the clock tree branch weight matrix.

18. The apparatus of claim 11, wherein the constructing a clock tree for driving the sequential devices according to the path delays between the sequential devices comprises:
constructing a path delay matrix according to the path delays between the sequential devices;
solving a clock tree branch weight matrix according to the path delay matrix; and
constructing the clock tree according to the clock tree branch weight matrix.

19. The apparatus of claim 11, wherein the constructing a clock tree for driving the sequential devices according to the path delays between the sequential devices comprises:
constructing a path delay matrix according to the path delays between the sequential devices, wherein the element of the path delay matrix denotes the delay of the data path between two sequential devices, wherein the path delay between two sequential devices that do not have a data pathway relationship is 0.

20. The apparatus of claim 12, wherein the minimum is given by the equation:

$$\Sigma_{j=0}^{2^t-1} \Sigma_{k=0}^{2^t-1} \text{DDLy}(j,k) \times \text{CKweight}(j,k).$$

* * * * *